United States Patent
Laven et al.

(10) Patent No.: US 9,825,131 B2
(45) Date of Patent: Nov. 21, 2017

(54) METHOD OF MANUFACTURING SEMICONDUCTOR DEVICES AND SEMICONDUCTOR DEVICE CONTAINING OXYGEN-RELATED THERMAL DONORS

(71) Applicant: Infineon Technologies AG, Neubiberg (DE)

(72) Inventors: Johannes Georg Laven, Taufkirchen (DE); Moriz Jelinek, Villach (AT); Hans-Joachim Schulze, Taufkirchen (DE); Werner Schustereder, Villach (AT); Michael Stadtmueller, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/146,459

(22) Filed: May 4, 2016

(65) Prior Publication Data

US 2016/0329401 A1  Nov. 10, 2016

(30) Foreign Application Priority Data

May 6, 2015  (DE) .......................... 10 2015 107 085

(51) Int. Cl.

| | |
|---|---|
| H01L 21/00 | (2006.01) |
| H01L 29/06 | (2006.01) |
| H01L 21/324 | (2006.01) |
| H01L 21/8234 | (2006.01) |
| H01L 29/739 | (2006.01) |

(52) U.S. Cl.
CPC ........ H01L 29/0692 (2013.01); H01L 21/324 (2013.01); H01L 21/8234 (2013.01); H01L 29/7393 (2013.01)

(58) Field of Classification Search
CPC .............. H01L 29/0692; H01L 21/324; H01L 21/8234; H01L 29/7393
USPC ............................................ 257/655; 438/45
See application file for complete search history.

(56) References Cited

U.S. PATENT DOCUMENTS

| 5,757,063 A * | 5/1998 | Tomita ................ H01L 21/3225 257/610 |
| 5,940,722 A * | 8/1999 | Tamura .................. C30B 15/00 257/E21.321 |
| 2012/0172648 A1* | 7/2012 | Seebauer ............... B82Y 30/00 585/733 |
| 2013/0273377 A1* | 10/2013 | Veerasamy ......... C03C 17/2453 428/432 |
| 2014/0254620 A1* | 9/2014 | Bessette ............. H01L 21/0237 372/45.01 |

* cited by examiner

Primary Examiner — Caleb Henry
(74) Attorney, Agent, or Firm — Baker Botts L.L.P.

(57) ABSTRACT

A method of manufacturing a semiconductor device includes determining information that indicates an extrinsic dopant concentration and an intrinsic oxygen concentration in a semiconductor wafer. On the basis of information about the extrinsic dopant concentration and the intrinsic oxygen concentration as well as information about a generation rate or a dissociation rate of oxygen-related thermal donors in the semiconductor wafer, a process temperature gradient is determined for generating or dissociating oxygen-related thermal donors to compensate for a difference between a target dopant concentration and the extrinsic dopant concentration.

17 Claims, 13 Drawing Sheets

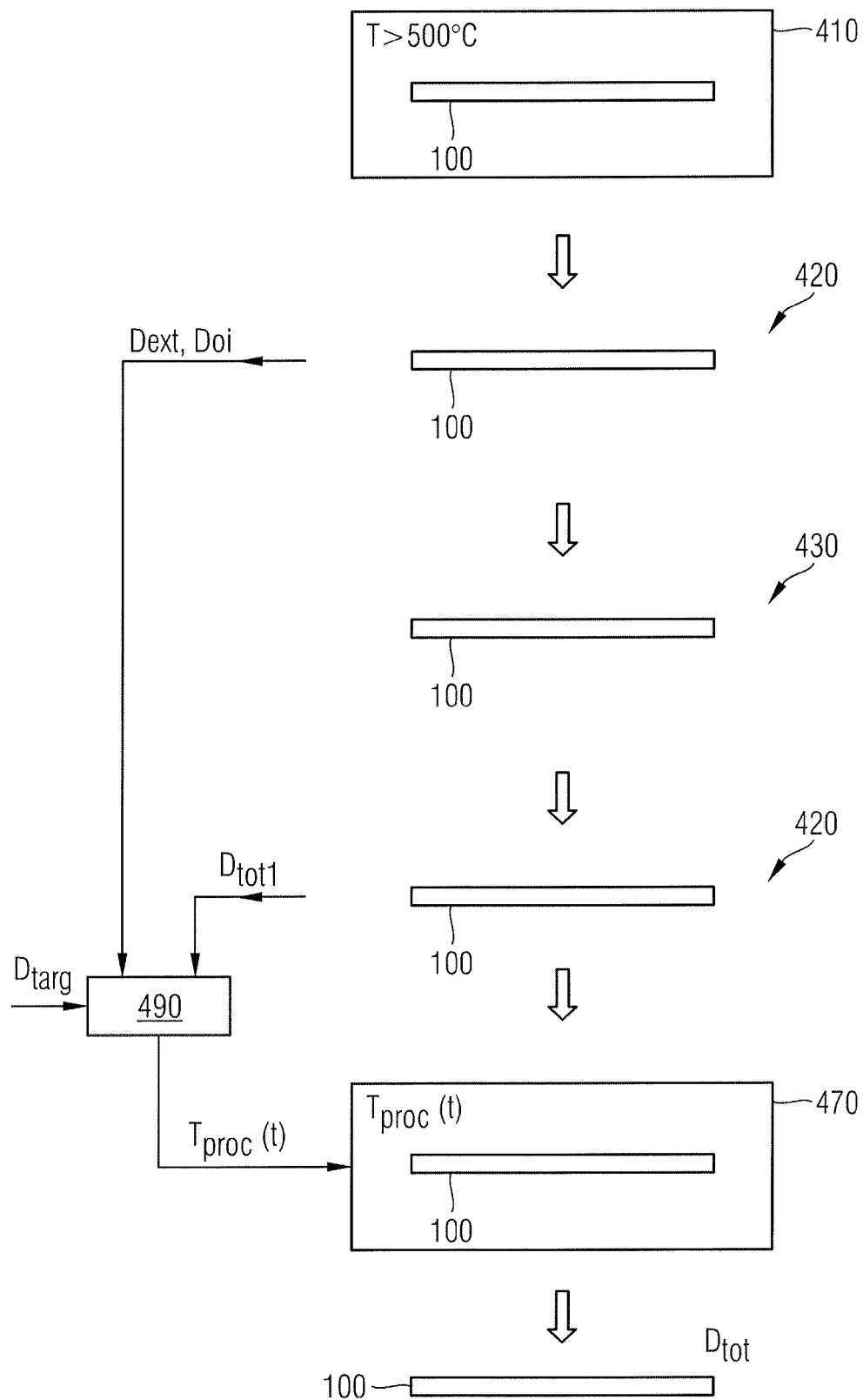

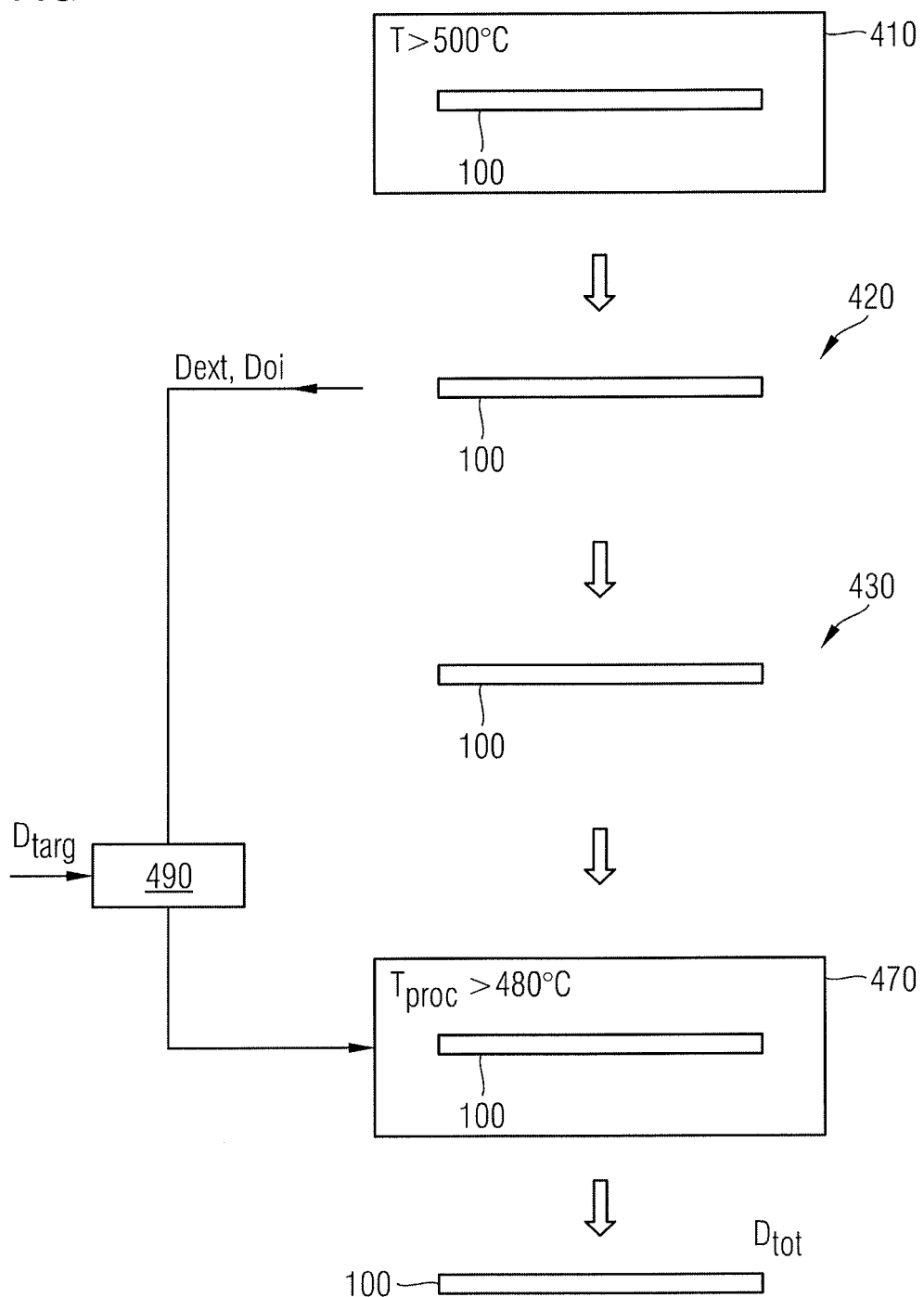

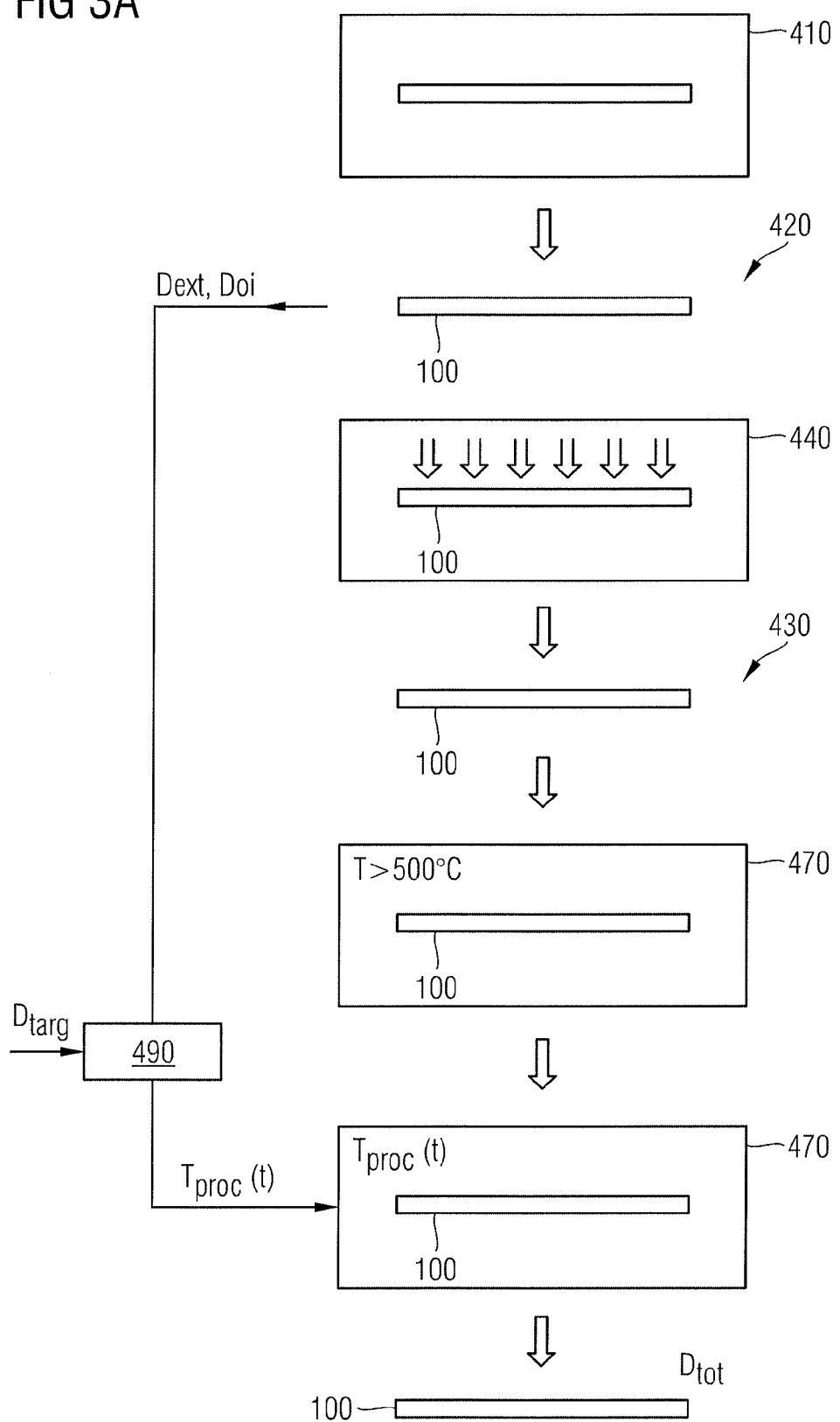

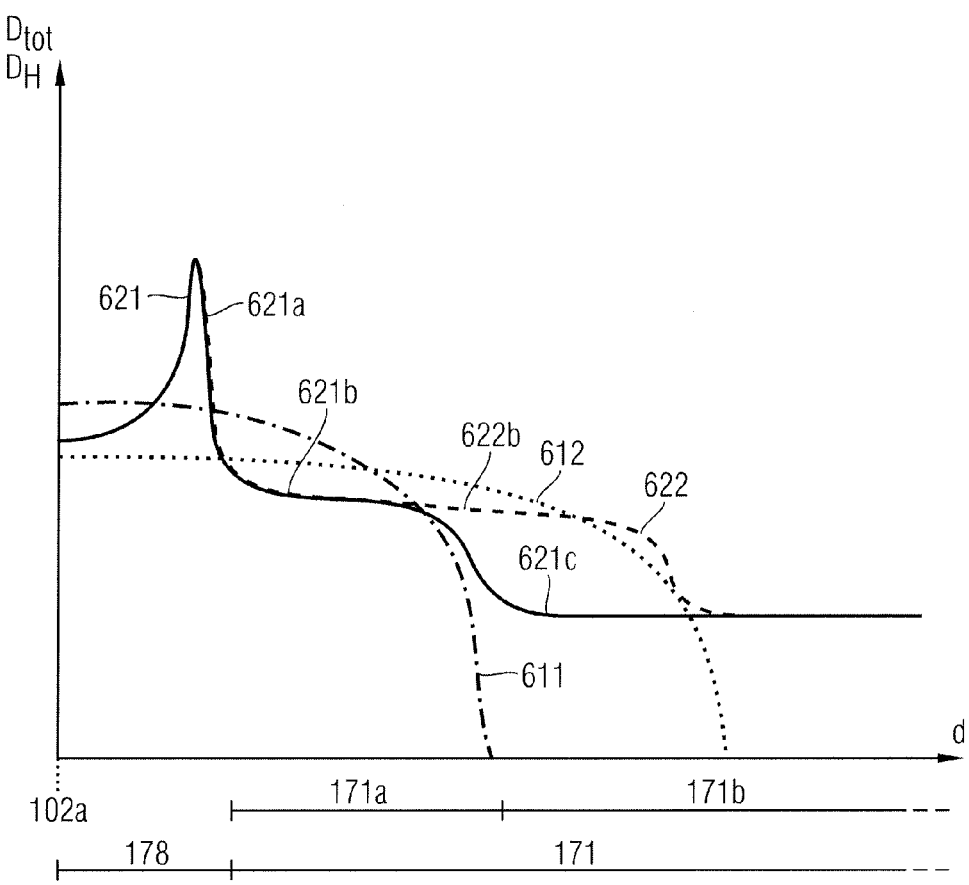

METHOD OF MANUFACTURING SEMICONDUCTOR DEVICES AND SEMICONDUCTOR DEVICE CONTAINING OXYGEN-RELATED THERMAL DONORS

CROSS-REFERENCE TO RELATED APPLICATION

This application claims priority to German Application Serial No. 102014P52147US filed May 6, 2015 and entitled "Method of Manufacturing Semiconductor Devices and Semiconductor Device Containing Oxygen-Related Thermal Donors"

BACKGROUND

Power semiconductor devices typically include a low-doped drift zone across which the blocking voltage drops. Typically the drift zone originates from an epitaxial layer grown on a heavily doped semiconductor base. In-situ doping during the epitaxial growth results in highly homogeneous distribution of the dopants within the epitaxial layer. Since the growth rate of epitaxial layers is about 1 µm per minute, the process is expensive when drift zones exceed a thickness of about 200 µm and more for blocking voltages beyond 2000 V. Therefore, semiconductor wafers for the manufacture of semiconductor devices with high blocking capability are typically obtained by sawing from silicon ingots grown from a localized molten zone. During the floating zone melting process, the growing silicon crystal typically incorporates dopant atoms at comparatively high homogeneity across the length and the diameter of the silicon ingot.

It is desirable to improve the manufacture of power semiconductor devices.

SUMMARY

According to an embodiment a method of manufacturing a semiconductor device includes determining information indicating an extrinsic dopant and an intrinsic oxygen concentration in a semiconductor wafer. On the basis of the information on the extrinsic dopant concentration and the intrinsic oxygen concentration as well as a generation rate or dissociation rate of oxygen-related thermal donors in the semiconductor wafer, a process temperature gradient for generating or dissociating oxygen-related thermal donors is determined to compensate for a difference between a target dopant concentration and the extrinsic dopant concentration.

According to another embodiment a semiconductor device includes a semiconductor portion that includes a drift zone with a total dopant concentration in the range from $1E12$ $cm^{-3}$ to $1E17$ $cm^{-3}$, wherein a ratio of oxygen-related thermal donors to a total of extrinsic donors and the oxygen-related thermal donors is at least 25%.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 2A is a schematic block diagram for illustrating a method of manufacturing a semiconductor device according to an embodiment that includes dissociating OTDs directly before measurement of the extrinsic dopant and the intrinsic oxygen concentrations as well as measuring a current total concentration of donors directly before forming a predetermined number of OTDs.

FIG. 2D is a schematic block diagram for illustrating a method of manufacturing a semiconductor device according to an embodiment that includes dissociating OTDs at a known dissociation rate without a previous generation step.

FIG. 3A is a schematic block diagram of a method of manufacturing a semiconductor device according to an embodiment including a hydrogen-assisted diffusion of ODTs.

FIG. 3B is a schematic diagram illustrating vertical hydrogen and oxygen-related thermal donor gradients.

DETAILED DESCRIPTION

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1A:
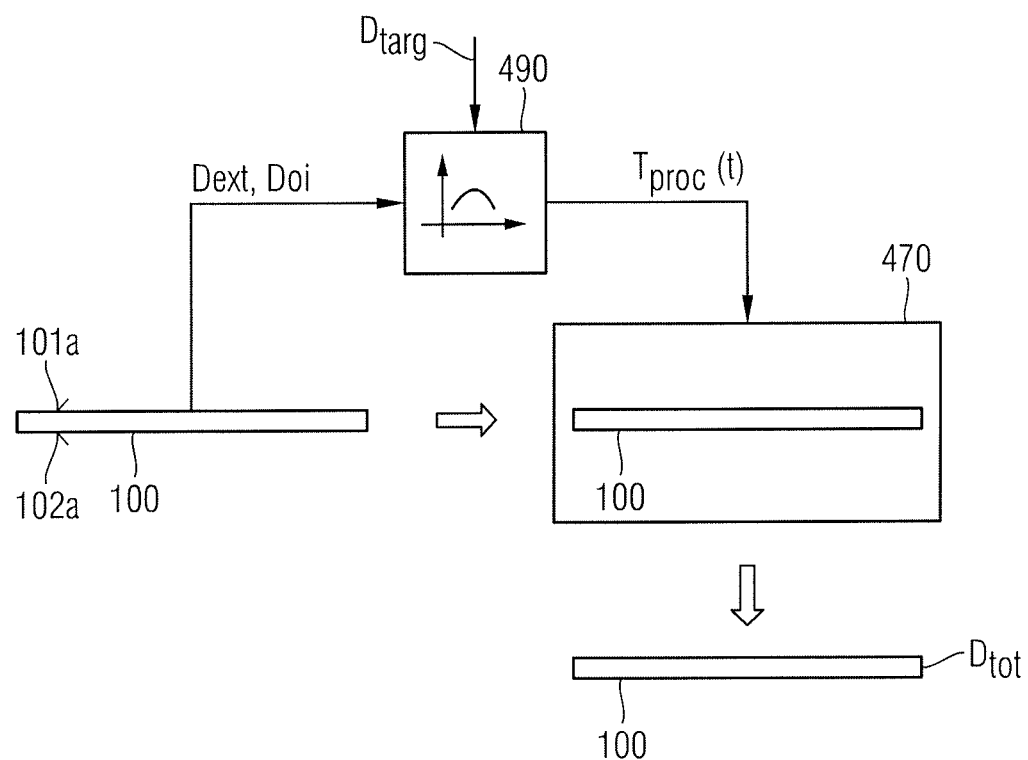
FIG. 1A is a schematic block diagram for illustrating a method of manufacturing a semiconductor device by determining information on an extrinsic dopant concentration and an intrinsic oxygen concentration and by compensating a difference between a target dopant concentration and the extrinsic dopant concentration by generating OTDs (oxygen-related thermal donors) in a feed-forward process.

FIG. 1A shows a semiconductor wafer 100 at different stages of processing. The material of the semiconductor wafer 100 is a crystalline semiconductor material, for example silicon (Si), silicon carbide (SiC), germanium (Ge), a silicon germanium crystal (SiGe), gallium nitride (GaN), gallium arsenide (GaAs) or any other $A_{III}B_V$ semiconductor. For example, the semiconductor wafer 100 is a single-crystalline silicon wafer with a planar front surface 101a and a supporting surface 102a on the back opposite to the front surface 101a. The semiconductor wafer 100 may be monocrystalline Czochralski silicon (Cz:Si) obtained by sawing a cylindrical silicon ingot extracted from a silicon melt in a crucible in a Czochralski process in the absence of magnetic fields. According to another embodiment the semiconductor wafer is magnetic Czochralski silicon (mCz:Si) obtained by applying a strong magnetic field controlling the convection flow in the silicon melt during extraction of the silicon ingot from the silicon melt.

Shape, dimensions and material of the semiconductor wafer 100 are compatible with production lines for silicon-based semiconductor devices. For example, the silicon wafer 100 may have an approximately cylindrical shape, wherein the diameter of the silicon wafer 100 may be at least 150 mm, e.g. 200 mm ("8 inch"), 300 mm ("12 inch"), or 450 mm ("18 inch"). A thickness of the semiconductor wafer 100 may be between 100 µm and several millimeters, e.g., in a range from 500 µm to 2 mm, by way of example.

A normal to the front surface 101a defines a vertical direction. Directions parallel to the front surface 101a are horizontal directions.

In a production line the semiconductor wafer 100 is subjected to a sequence of processes for forming electronic elements in and on the semiconductor wafer 100. At a suitable stage of processing information as regards the extrinsic dopant concentration Dext and the intrinsic oxygen concentration Doi is obtained.

The extrinsic dopant concentration Dext is the net dopant concentration resulting from the total content of donors and acceptors, e.g., n-type phosphorus (P) and arsenic (As) atoms as well as p-type boron (B) atoms, and may be in a range from 0 to 1E14 $cm^{-3}$, e.g., from 5E12 $cm^{-3}$ to 1E14 $cm^{-3}$. The intrinsic oxygen concentration Doi is the concentration of interstitial oxygen solved in the silicon crystal. The oxygen content is sufficiently high such that a sufficient number of OTDs (oxygen-related thermal donors) can be formed and at the same time is sufficiently low to avoid formation of oxygen precipitates. According to an embodiment, the intrinsic oxygen concentration is in a range from 2E17 $cm^{-3}$ to 6E17 $cm^{-3}$, e.g., in a range from 3E17 $cm^{-3}$ to 5E17 $cm^{-3}$.

The extrinsic dopant concentration Dext as well as the intrinsic oxygen concentration Doi may be directly measured independently from each other. For example, the semiconductor wafer 100 may be heated up to a temperature at which OTDs, which are present at an initial state of the wafer, dissociate after a certain time. Before any further process at temperatures at which OTDs may be regenerated, the intrinsic oxygen concentration Doi may be measured by infrared spectroscopy. At the same time, the extrinsic dopant concentration Dext may be determined by a sheet resistance measurement.

The extrinsic dopant concentration Dext and the intrinsic oxygen concentration Doi may be measured at the beginning of a process sequence for forming electronic elements in the semiconductor wafer 100 or at any later stage before the semiconductor wafer 100 is separated into a multitude of identical semiconductor dies, e.g., by sawing or laser cutting. Since both the extrinsic dopant concentration Dext and the intrinsic oxygen concentration Doi vary only little along the longitudinal axis of a silicon ingot, e.g., an Cz:Si ingot, the measurement of both parameters in one semiconductor wafer 100 may be sufficiently representative for a number of neighboring wafers and measurements are performed for each n-th semiconductor wafer 100 only, with n being an integer value greater 1, e.g., greater 5 or greater than 9 or greater than 16.

From the extrinsic dopant concentration Dext and the intrinsic oxygen concentration Doi a control unit 490 determines a process temperature gradient Tproc(t) for a heat treatment that results in a predefined number of OTDs such that a final total dopant concentration Dtot including both extrinsic dopants and OTDs fulfills a predetermined condition, e.g., deviates by not more than 13%, by not more than 8% or by not more than 5% from a target dopant concentration Dtarg.

The process temperature gradient Tproc(t) may be an isothermal gradient defined by a constant process temperature Tproc, a process time tproc during which the process temperature Tproc is applied as well as falling and trailing temperature ramps before and after applying Tproc.

The control unit 490 may determine the process temperature gradient Tproc(t), e.g., a constant process temperature Tproc and a process time tproc for applying the constant process temperature Tproc, by considering both a known OTD generation rate and information about the current content of OTDs, or, in the alternative, assuming the absence of any OTDs. According to another embodiment, the control unit 490 determines the process temperature gradient Tproc (t) by considering an OTD dissociation rate in the semiconductor wafer 100. The effective temperature range for forming OTDs in silicon is a range from 350° C. to about 500° C., e.g., from 400° C. to 500° C.

The semiconductor wafer 100 may be subjected to the heat treatment in a heating chamber 470 at any later stage of processing after obtaining the information on the extrinsic dopant concentration Dext as well as on the intrinsic oxygen concentration Doi and before the semiconductor wafer 100 is separated into a plurality of identical semiconductor dies. According to an embodiment, the heat treatment is performed after forming metallization layers on the first surface and on the supporting surface. The heat treatment may be a dedicated heat treatment exclusively serving for generating the desired number of OTDs.

According to other embodiments, the heat treatment may serve a further purpose, for example, for annealing implant damages or for the formation of ohmic metallic contacts. For example, the activation of a field stop implant may be combined with the generation of OTDs. The temperature of the activation of the field stop implant may be at about 450° C., where the OTD generation rate is comparatively high and the activation of protons shows only a low degree of dependence from time such that the duration of the heat treatment can be adapted to the desired OTD concentration.

If the heat treatment is based on the generation of OTDs, a preceding auxiliary heat treatment may heat up the semiconductor wafer 100 to a temperature at which oxygen-related thermal donors completely dissociate after a certain time. The auxiliary heat treatment may be performed at temperatures exceeding 500° C., e.g. at 1000° C. The minimum duration of the heat treatment is a function of the temperature of the heat treatment and may be at least 10 seconds for a temperature about 1000° C. and at least 500 minutes, for example, at least 90 minutes or at least 30 minutes for a temperature close to 500° C. Then, the desired concentration is adjusted by a main heat treatment at a process temperature Tproc between 350° C. and 500° C. According to an embodiment the process temperature Tproc is in a range from 420 to 480° C. to achieve a high OTD generation rate.

If the heat treatment is based on a defined dissociation rate, a preceding auxiliary heat treatment may heat up the semiconductor wafer 100 to a temperature below the dissociation temperature to generate a stable maximum concentration of OTDs. For example, the auxiliary heat treatment may be performed at 420° C. and may last for at least five, for example for about ten hours. Then, the desired OTD concentration is adjusted by a main heat treatment at process temperatures above the dissociation temperature, for example, at 480° C. for the determined process time tproc. Other than the generation rates which show a strong dependency on the intrinsic oxygen concentration Doi, the dissociation rates are more independent from the intrinsic oxygen concentration Doi such that the desired OTD concentration Doi can be adjusted more precisely.

When a silicon crystal containing intrinsic oxygen is heated for periods of hours at temperatures between 420° C. and 480° C., formation of donors can be observed, wherein the concentration of donors increases with time and reaches a characteristic maximum after several hours. The time to attain the maximum donor concentration increases with decreasing oxygen concentration. A heat treatment above a dissociation temperature, e.g., at a temperature higher than 500° C. reduces the number of donors. The current model assumes that a heat treatment above a temperature of about 420° C. starts an agglomeration of oxygen in the silicon crystal. The heating successively generates oxygen clusters from monomeric oxygen to dimeric oxygen to trimeric oxygen and to further oxygen clusters containing five or eight and more oxygen atoms. Between the various oxygen clusters dynamic equilibria exist that depend on the current temperature. Some of the oxygen clusters are electrically active donors.

In the method of FIG. 1A a feed-forward control completes an original background donor concentration to a desired target donor concentration by filling a gap between a target dopant concentration Dtarg and the extrinsic dopant concentration Dext with OTDs. The feed-forward control allows the use of semiconductor wafers 100 with a comparatively high spread as regards the original extrinsic dopant concentration. For example, the method allows the use of Cz:Si or mCz:Si, which both exhibit a strong gradient of the extrinsic doping concentration along the axial rod position for the manufacture of power semiconductor devices for high blocking voltages, wherein the power semiconductor devices can be manufactured without epitaxy. Since the extrinsic dopant and intrinsic oxygen concentrations vary only little along a longitudinal axis of a silicon ingot, both values may be measured only for semiconductor wafers 100 formed from distant portions of the same silicon ingot and the values for semiconductor wafers from intermediate portions of the silicon ingot may be interpolated from the measured values.

Figure 1B:
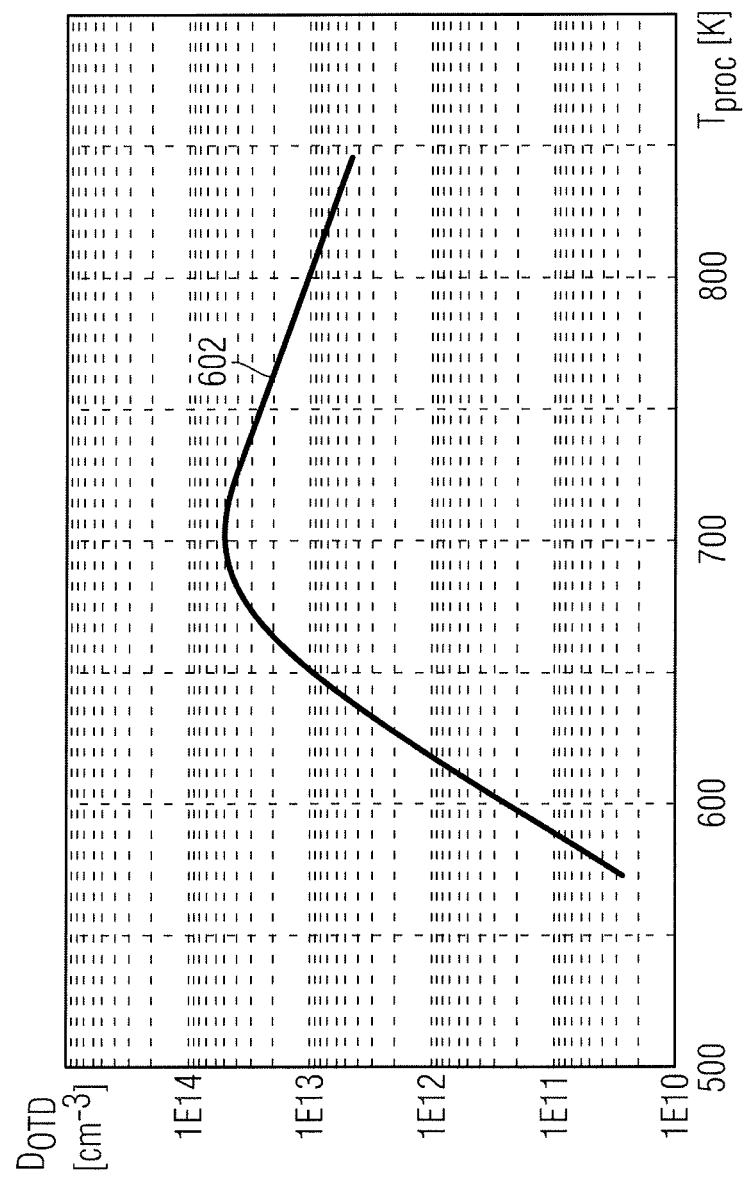
FIG. 1B is a schematic diagram illustrating the OTD concentration as a function of a heating temperature at a heating period of 5 hours and at an intrinsic oxygen concentration of $4E17$ $cm^{-3}$.

In FIG. 1B gradient 602 shows the concentration DOTD of oxygen-related thermal donors versus a heating temperature in Kelvin for a process time tproc of 5 hours and at an intrinsic oxygen concentration Doi of $4E17$ cm$^{-3}$. From the gradient 602 it can be concluded that for a measured extrinsic dopant concentration of $1E13$ cm$^{-3}$ a heat treatment lasting for 5 hours at a temperature of 650 K generates an OTD concentration DOTD of $1E13$ cm$^{-3}$ to obtain a total dopant concentration Dtot of $2E13$ cm$^{-3}$. The gradient 602 of FIG. 1B and other known gradients for isochronal and/or isothermal annealing may form the basis on which an estimation process in the central unit 490 determines a suitable process temperature gradient Tproc(t).

FIG. 2A refers to an embodiment based on a direct measurement of the extrinsic dopant concentration Dext and the intrinsic oxygen concentration Doi.

A first heat treatment at a temperature above the dissociation temperature of the OTDs, e.g., above 500° C., dissolves possible OTDs in the semiconductor wafer 100 in a first heating chamber 410. As a result, a following measurement of the extrinsic dopant concentration Dext at a first inspection station 420 is not influenced by any OTDs. The first inspection station 420 may measure the extrinsic dopant concentration Dext and the intrinsic oxygen concentration Doi. Then a sequence of processes for forming electronic elements in and on the semiconductor wafer 100 may be performed in a production line 430. The first or another, second inspection station 420 may measure the current total dopant concentration Dtot1, wherein the current total dopant concentration Dtot1 includes the extrinsic dopants as well as OTDs formed during the processes performed in the production line 430.

On the basis of Dext, Doi, Dtot1 and the pertinent generation rates for OTDs, a control unit 490 determines the process temperature gradient Tproc(t) for generating a sufficient number of OTDs to obtain a target dopant concentration Dtarg.

The first or another heating chamber 470 applies the process temperature gradient Tproc(t) to the semiconductor wafer 100. At the end of the heat treatment in the heating chamber 470, the semiconductor wafer 100 contains a final total dopant concentration Dtot including extrinsic dopants and OTDs and deviating by not more than 13%, e.g., not more than 8% or not more than 5%, e.g., by not more than 2% from the target donor concentration Dtarg.

Figure 2B:
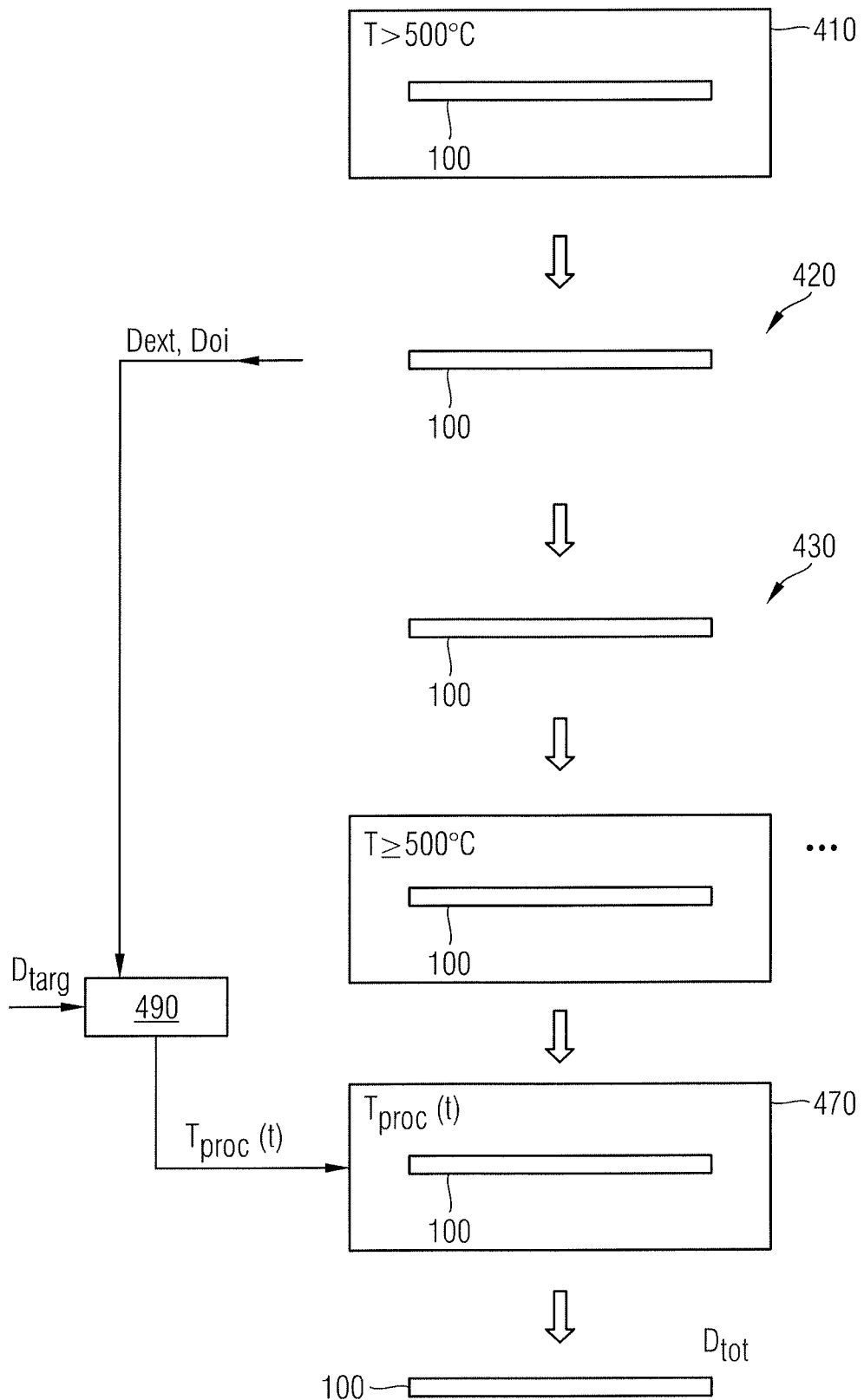
FIG. 2B is a schematic block diagram for illustrating a method of manufacturing a semiconductor device according to an embodiment that includes dissociating OTDs directly before measurement of the extrinsic dopant and intrinsic oxygen concentrations and directly before forming a predetermined number of OTDs.

The method illustrated in FIG. 2B replaces the measurement of the current total dopant concentration Dtot1 with an auxiliary heat treatment in the heating chamber 470 to dissociate any OTDs possibly formed during the formation of electronic elements in the production line 430. The auxiliary heat treatment applies a temperature above the dissociation temperature of thermal donors, e.g., a temperature above 500° C. The duration of the auxiliary heat treatment is a function of the temperature. An auxiliary heat treatment at about 500° C. may last for at least 300 or 100 minutes, whereas a heat treatment at 1000° C. may last less than a minute and more than about 10 seconds.

The auxiliary heat treatment may be a dedicated heat treatment exclusively serving for dissociating the OTDs. According to other embodiments, the heat treatment may serve a further purpose. For example, a heat treatment for annealing implant damages or for forming ohmic metallic contacts may dissociate OTDs possibly formed up to that time. According to an embodiment a heat treatment for controlling a reflow of an interlayer dielectric based on a silicate glass such as BSG (boron silicate glass), PSG (phosphorus silicate glass) or BPSG (boron phosphorus silicate glass) is effective as the auxiliary heat treatment and dissociates the OTDs present at that point in time.

Figure 2C:
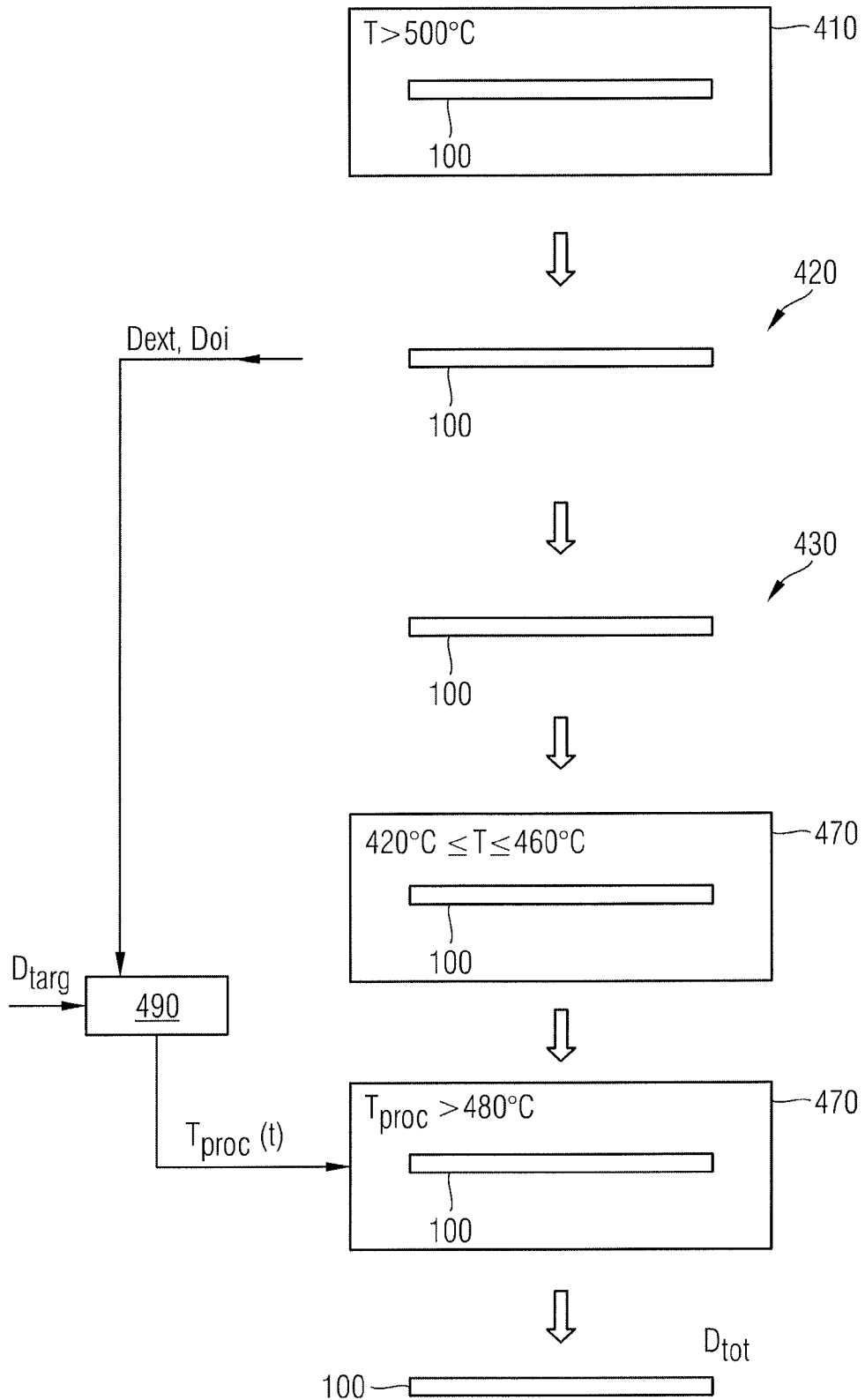
FIG. 2C is a schematic block diagram for illustrating a method of manufacturing a semiconductor device according to an embodiment that includes dissociating OTDs at a known dissociation rate.

While the previous embodiments rely on knowledge about the OTD generation rates, the method illustrated in FIG. 2C relies on knowledge about the dissociation rates.

An auxiliary heat treatment in the heating chamber 470 at a temperature below the dissociation temperature generates a stable maximum concentration of OTDs. For example, the auxiliary heat treatment may be performed at 420° C. and lasts for at least five, for example for about ten hours. A subsequent main heat treatment at process temperatures above the dissociation temperature, for example, at a process temperature of at least 480° C. for a determined process time tproc adjusts the desired OTD concentration Doi. Since the dissociation rates are more independent from the intrinsic oxygen concentration Doi than the generation rates, the desired OTD concentration DOTD as well as the final total dopant concentration Dtot can be adjusted more precisely.

The process in FIG. 2D differs from the process of FIG. 2C in that instead of an auxiliary heat treatment a reflow of an interlayer dielectric based on a silicate glass dissociates OTDs possibly formed before.

Figure 2E:
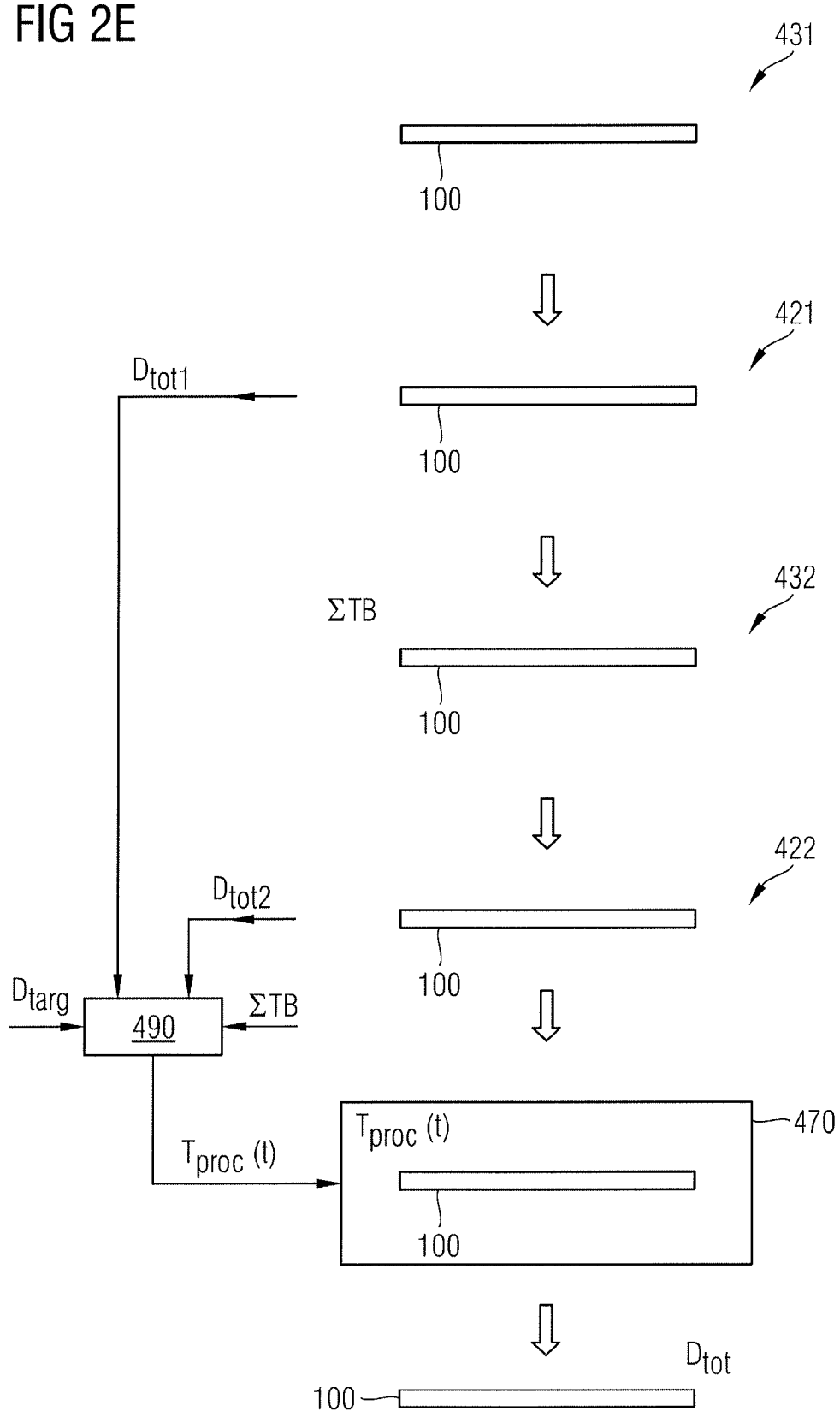
FIG. 2E is a schematic block diagram for illustrating a method of manufacturing a semiconductor device according to an embodiment based on two measurements of a total dopant concentration at different points in time.

The method illustrated in FIG. 2E refers to two successive measurements of the total dopant concentration Dtot1, Dtot2, wherein between the two measurements a significant thermal budget between 420° C. and 470° C. is applied to the semiconductor wafer 100. The first measurement of the total dopant concentration Dtot1 may be performed at a first inspection station 421 at the beginning of a production line, after the semiconductor wafer 100 has passed a first portion 431 of the production line for forming electronic elements on the semiconductor wafer 100 or, e.g., after a process applying a temperature above the dissociation temperature. The second measurement of a second dopant total concentration Dtot2 may be performed at the first or a second inspection station 422 after the semiconductor wafer 100 has passed a second portion 132, which may be a final portion of sequences of processes for forming electronic elements on the semiconductor wafer 100.

The control unit 490 receives both measurement results Dtot1, Dtot2 and also receives information about the time the semiconductor wafer 100 has been exposed to temperatures in a range from 350° C. to 500° C. or, e.g., between 400° C. and 480° C. Then, by analyzing a correlation between the OTD concentration and the applied thermal budget ΣTB in the thermal range of interest during the second portion of the production line 432, the control unit 490 has available information equivalent to the information on an extrinsic dopant concentration Dext and the intrinsic oxygen concentration Doi to determine a process temperature gradient Tproc(t) for generating a desired number of OTDs.

The embodiment of FIG. 3A includes a proton implant in an implant chamber 440 and may be combined with any of the processes of FIGS. 2A to 2E. The proton implant may be performed at any stage before the beginning of processing in the production line 430 up to the end. The proton implant may be a dedicated process for supporting the formation of OTDs or may serve a further purpose, e.g., the formation of doped regions such as a field stop zone based on HDs (hydrogen-related donors). The proton implant may significantly reduce process time and costs by increasing the OTD generation rate.

The implanted hydrogen atoms and the intrinsic oxygen atoms may cooperate to mutually assist diffusing into the silicon crystal, wherein the oxygen atoms locally damage the silicon lattice, the generated crystal lattice defects promote the diffusion of hydrogen atoms, and hydrogen atoms forming complexes with the silicon atoms in turn promote the further diffusion of oxygen atoms. In layers with increased hydrogen content, the hydrogen may smooth radial variations of the intrinsic oxygen distribution.

FIG. 3B plots a hydrogen concentration DH and a total dopant concentration Dtot in a semiconductor wafer 100 against a distance d to the supporting surface 102a. A first hydrogen profile 611 in the semiconductor wafer 100 of FIG. 3A results from a short hydrogen diffusion of electrically inactive hydrogen originating from the hydrogen implantation. A first total dopant profile 621 shows a peak 621a resulting from hydrogen-related donors around an implant depth of the hydrogen implant within a field stop layer 178. The first total dopant profile 621 further shows a high plateau 621b in a first portion 171a of a drift layer 171 next to the field stop layer 178, where the presence of hydrogen accelerates the formation of OTDs, and a low plateau 621c in a second portion 171b of the drift layer 171, where hydrogen is absent. A second hydrogen profile 612 results from a long hydrogen diffusion of the electrically inactive hydrogen that may originate from the hydrogen implant. A second total dopant profile 622 shows a longer high plateau 622b where the presence of hydrogen accelerates the formation of OTDs.

Figure 4A:
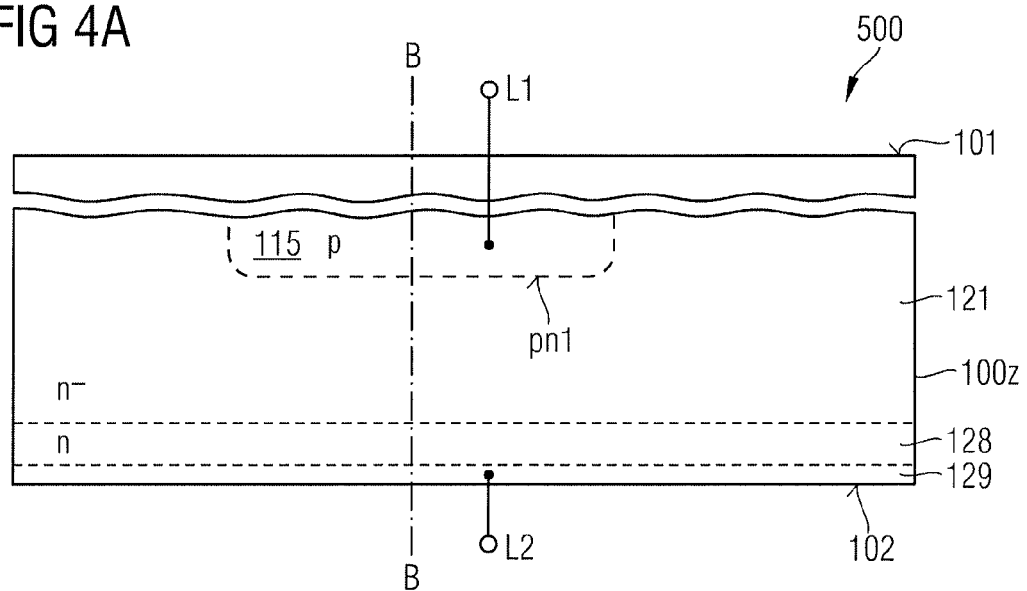
FIG. 4A is a schematic vertical cross-sectional view through a power semiconductor device with a drift zone in which OTDs represent at least 25% of the total dopant concentration according to an embodiment.

FIG. 4A illustrates a power semiconductor device 500. A single crystalline semiconductor material, e.g. silicon, forms a semiconductor portion 100z with a planar first surface 101 at a front side as well as a planar second surface 102 parallel to the first surface 101 on the back opposite to the front side.

A minimum distance between the first and second surfaces 101, 102 depends on the voltage blocking capability of the power semiconductor device 500. For example, the distance between the first and second surfaces 101, 102 may be in a range from 90 µm to 200 µm in case the power semiconductor device 500 is specified for a blocking voltage of about 1200 V. Other embodiments related to power semiconductor devices with higher blocking capabilities may provide semiconductor portions 100z with a thickness up to several 100 µm.

In a plane parallel to the first surface 101 the semiconductor portion 100z may have a rectangular shape with an edge length in the range of several millimeters or a circular shape with a diameter of several centimeters. Directions parallel to the first surface 101 are horizontal directions and directions perpendicular to the first surface 101 are vertical directions.

The semiconductor portion 100z includes one doped region 115 or a plurality of first doped regions 115 electrically connected to a first load terminal L1. A heavily doped contact layer 129 is formed along the second surface 102 and is electrically connected to a second load terminal L2.

A weakly doped drift zone 121 forms one or more pn junctions pn1 with the one or more first doped regions 115. An effective dopant concentration in the drift zone 121 may be at least $1E12$ cm$^{-3}$ and at most $1E17$ cm$^{-3}$, typically in the range between $1E13$ cm$^{-3}$ and $4E14$ cm$^{-3}$. The doping in the drift zone 121 may correspond to an initial background doping in the semiconductor portion 100z. At least 25%, e.g., at least 50% of the donors in the drift zone 121 are OTDs. The further donors in the drift zone 121 may be hydrogen-related donors or extrinsic dopant atoms such as arsenic and/or phosphorus atoms.

A field stop zone 128 may separate the contact layer 129 and the drift zone 121 and forms either an unipolar homojunction or a pn junction with the contact layer 129 and an unipolar homojunction with the drift zone 121. The field stop zone 128 may contain HDs based on an implant of light ions, e.g., protons and/or extrinsic dopant atoms such as phosphorus and arsenic atoms.

Figure 4B:
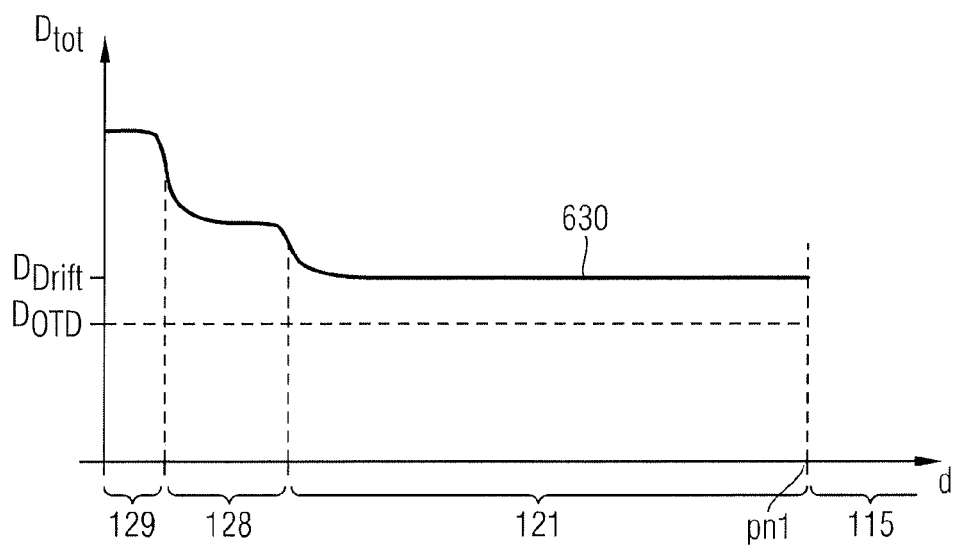
FIG. 4B is a schematic diagram illustrating a vertical dopant profile through the power semiconductor device of FIG. 4A according to an embodiment concerning a field stop zone containing dopant atoms.

FIG. 4B shows a vertical dopant profile 630 along line B-B of FIG. 4A.

The contact layer 129 may be n-doped or p-doped or may include zones of both conductivity types. The dopant concentration in the contact layer 129 along the second surface 102 is sufficiently high to form an ohmic contact with a load electrode directly adjoining the second surface 102. For example, an n-doped contact layer 129 may have a mean net dopant concentration in a range from $1E18$ cm$^{-3}$ to $1E20$ cm$^{-3}$, for example from $5E18$ cm$^{-3}$ to $5E19$ cm$^{-3}$. The predominant dopants in the contact layer 129 may be extrinsic dopant atoms such as boron (B) atoms, arsenic (As) atoms or phosphorus (P) atoms.

In the field stop zone 128 the mean net dopant concentration is at most 10% of the maximum dopant concentration in the contact layer 129. For example, the mean dopant concentration in the field stop zone 128 may be in a range from $1E15$ cm$^{-3}$ to $1E18$ cm$^{-3}$, for example from $1E16$ cm$^{-3}$ to $5E17$ cm$^{-3}$, by way of example. The vertical extension of the field stop zone 128 may be in a range from 1 µm to 20 µm, for example from 2 µm to 10 µm. The predominant dopants in the field stop zone 128 may be extrinsic dopants or HDs.

In the drift zone 121 the mean net dopant concentration is in a range from $1E12$ cm$^{-3}$ to $1E17$ cm$^{-3}$, for example in a range from 3E12 to 5E15 or from $1E14$ cm$^{-3}$ to $5E15$ cm$^{-3}$. In the drift zone 121 the ratio of OTDs to the total dopants is at least 25%, e.g., at least 50%. The further dopants in the drift zone 121 may be extrinsic dopants or HDs. The vertical dopant profile 630 may show steps along the transitions between the contact layer 129 and the field stop zone 128 as well as between the field stop zone 128 and the drift zone 121.

Figure 4C:
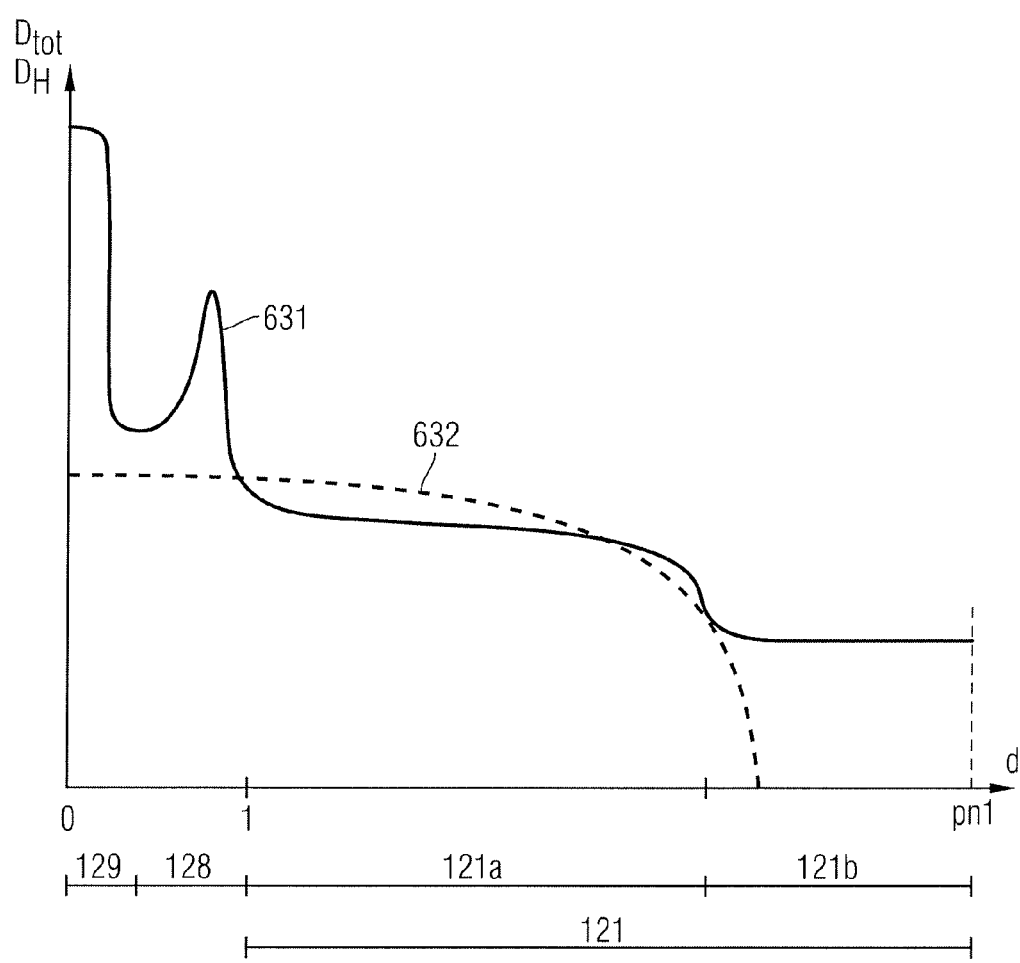
FIG. 4C is a schematic diagram of a vertical dopant profile of the power semiconductor device of FIG. 4A according to an embodiment based on hydrogen-assisted diffusion of OTDs.

FIG. 4C plots a hydrogen concentration DH and a total dopant concentration Dtot in a power semiconductor device with a field stop zone 128 that originates from a hydrogen implant against a distance d to the second surface 102 and shows a vertical total dopant profile 631 based on a hydrogen-assisted diffusion of OTDs. For example, if the semiconductor device 500 is a semiconductor switching device such as a PT-IGBT (punch through-IGBT) and turns off, a depletion zone, across which the blocking voltage drops, gradually expands, wherein expansion starts from a pn junction pn1 at the right hand side of the diagram.

The field stop zone 128 avoids that the depletion zone and the electric field in the gradually expanding depletion zone reach an electrode at d=0 at the rear side or a backside emitter. When the electric field expands into the direction of the rear side, the power semiconductor device 500 can continuously supply charge carriers from the contact layer 129 for supporting an external current flow.

When extrinsic dopant atoms such as arsenic or phosphorous atoms are used as dopants in the field stop zone 128, the diffusion properties of the extrinsic dopant atoms result in smooth, Gaussian-like dopant profiles. Since the number of mobile charge carriers is high where the number of stationary charge carriers such as dopant atoms in the field stop zone 128 is low due to a higher emitter efficiency and vice versa, with expanding depletion zone the number of free charge carriers available for sustaining an external current increases steadily and the snappiness of such PT-IGBTs is low. However, outdiffusion of dopant atoms implanted from a rear side requires a thermal budget which may damage structures and dopant gradients in previously formed doped zones on the front side of the PT-IGBT.

Alternatively, the field stop zones 128 may be formed by generating HDs after completion of processing at the front side. Conventional light ion implants from the rear side, however, show steep HD profile transitions on the side of the drift zone 121, wherein such steep transitions tend to deteriorate the switching behavior.

According to the embodiment of FIG. 4C hydrogen is diffused into the field stop zone 128 and an adjoining first portion 121a of the drift zone 121. The hydrogen promotes the formation of OTDs.

FIG. 4C shows that the hydrogen-assisted formation of OTDs may result in a more gradual transition of the OTD concentration such that the semiconductor device 500 can gradually dissipate the electric field at an early point in time after the switching process has been triggered. Since the depletion zone can gradually expand in a smooth, less abrupt manner, the hydrogen-assisted formation of OTDs may improve snappiness of the semiconductor device 500 at a given total thickness of the semiconductor device 500. The charge carriers outside the expanding depletion zone are continuously available for supplying a current induced by external circuit elements.

Hydrogen-assisted formation of OTDs allows for combining the formation of the field stop zones 128 from the rear side at a late process stage with a gradual transition of effective dopant concentrations between the contact layer 129 and the drift zone 121.

Figure 5A:
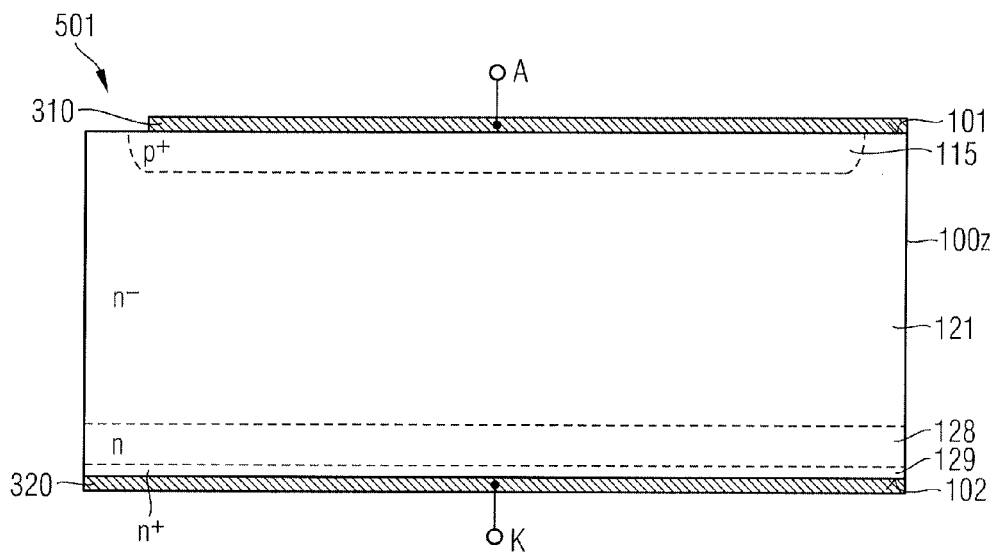
FIG. 5A is a schematic vertical cross-sectional view of a power semiconductor diode with OTDs representing at least 25% of a total dopant concentration in a drift zone according to an embodiment.

FIG. 5A shows a power semiconductor diode 501 with a nominal forward current greater 1000 mA, e.g., greater 10 A or greater 100 A, on the basis of the semiconductor device 500 of FIG. 4A. The first doped region 115 forms an ohmic contact with a first load electrode 310 at the front side. The first load electrode 310 forms or is electrically connected to an anode terminal A. The heavily doped contact layer 129 forms an ohmic contact with a second load electrode 320 on the back. The second load electrode 320 forms or is electrically connected to a cathode terminal K.

Figure 5B:
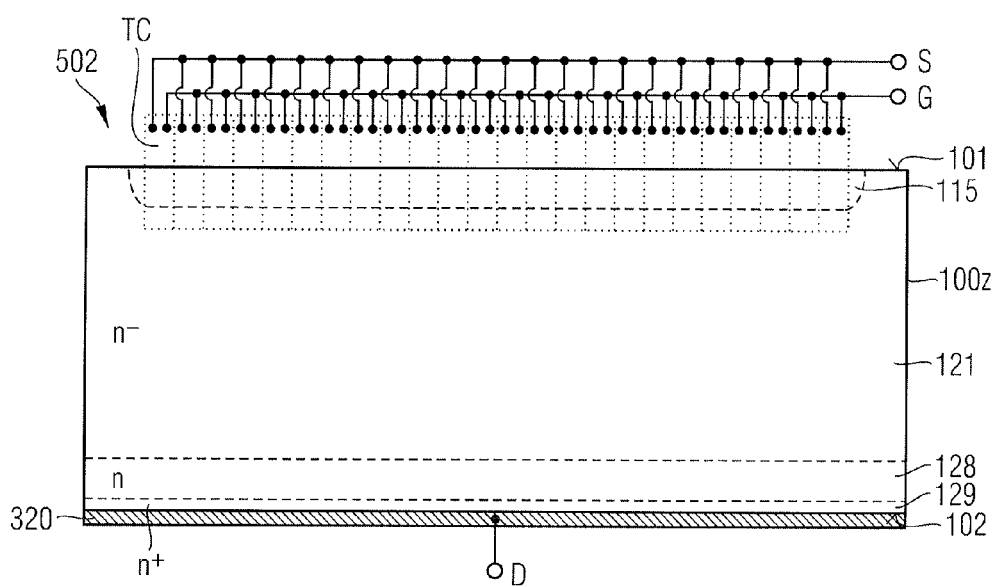
FIG. 5B is a schematic vertical cross-sectional view of an IGFET (insulated gate field effect transistor) with OTDs representing at least 25% of a total dopant concentration in a drift zone according to a further embodiment.

FIG. 5B refers to an IGFET 502. As regards details of the semiconductor portion 100z, the drift zone 121, the field stop zone 128, the contact layer 129, which is effective as drain, and the vertical dopant profile reference is made to the description of FIGS. 4A to 4C and 5A. The IGFET 502 includes transistor cells TC, which may be IGFET cells with n-doped source zones and with the first doped regions 115 forming body zones of the transistor cells TC. The body zones separate the source zones from the drift zone 121, respectively. The source zones may be electrically connected or coupled to a first load electrode at the front side. The first load electrode may form or may be electrically connected to a source terminal S.

Gate electrodes of the transistor cells TC may be electrically connected or coupled to a gate terminal G and may be capacitively coupled to the body zones through gate dielectrics. Subject to a voltage applied to the gate terminal G, inversion channels are formed in the body zones and provide an electron flow through the transistor cells TC such that in an on-state of the IGFET 502 electrons enter the drift zone 121 through the transistor cells TC.

The transistor cells TC may be planar cells with lateral gate structures arranged outside the contour of the semiconductor portion 100z or trench cells with trench gate structures extending from the first surface 101 into the semiconductor portion 100z. For example, the source and body zones of the transistor cells TC may be formed in semiconductor mesas separated by the trench gate structures.

Figure 5C:
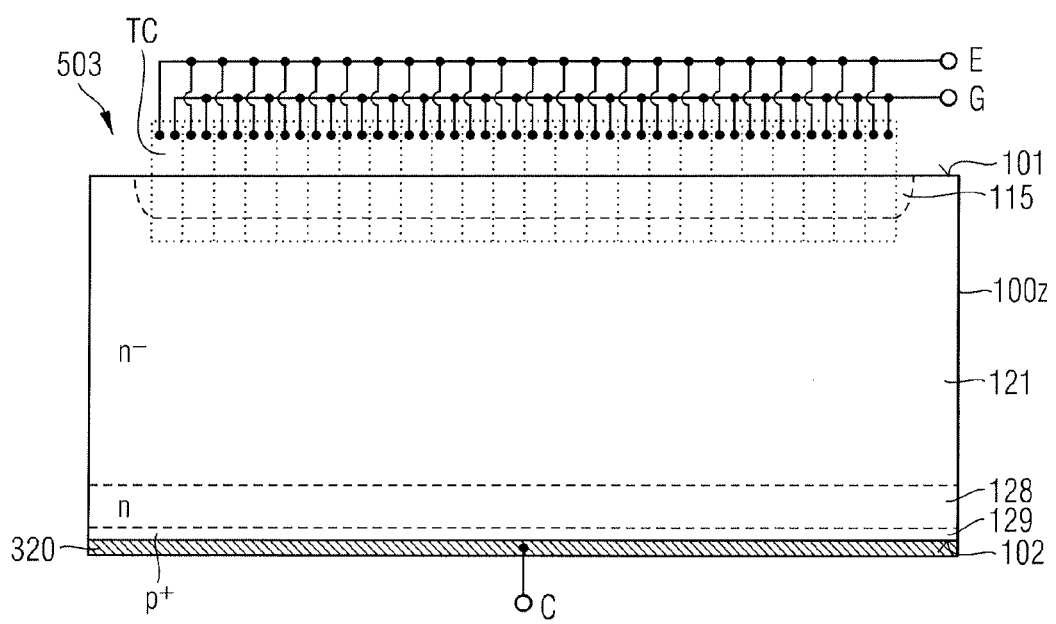
FIG. 5C is a schematic vertical cross-sectional view of an IGBT (insulated gate bipolar transistor) with OTDs representing at least 25% of a total dopant concentration in a drift zone according to another embodiment.

FIG. 5C refers to an IGBT 503, for example an PT-IGBT with a p-type contact layer 129 and the second load electrode 320 electrically connected to a collector terminal C. The source and body zones are electrically connected or coupled to an emitter terminal E. For further details, reference is made to the description of the power semiconductor diode 501 of FIG. 5A and the IGFET 502 of FIG. 5B.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor device, the method comprising
   determining information indicating an extrinsic dopant concentration and an intrinsic oxygen concentration in a semiconductor wafer;
   determining, on the basis of information about the extrinsic dopant concentration and the intrinsic oxygen concentration as well as a generation rate or a dissociation rate of oxygen-related thermal donors in the semiconductor wafer, a process temperature gradient for generating or dissociating oxygen-related thermal donors to compensate for a difference between a target donor concentration and the extrinsic dopant concentration, wherein the target donor concentration is greater than an extrinsic donor concentration; and
   subjecting the semiconductor wafer to a main heat treatment that applies the process temperature gradient.

2. The method of claim 1, wherein
   determining the intrinsic oxygen concentration comprises measuring the intrinsic oxygen content after a heat treatment dissociating oxygen-related thermal donors and before heating the semiconductor wafer to a temperature beyond 350° C.

3. The method of claim 1, wherein
   determining the extrinsic dopant concentration comprises dissociating oxygen-related donors by heating the semiconductor wafer up to a temperature higher 480° C. and measuring the extrinsic dopant concentration after dissociating the oxygen-related thermal donors and before heating the semiconductor wafer to a temperature beyond 350° C.

4. The method of claim 1, wherein
   determining the extrinsic dopant concentration and the intrinsic oxygen concentration comprises measuring a first total dopant concentration, then heating the semiconductor wafer to a temperature higher 350° C., measuring a second total dopant concentration after the heating, and determining the extrinsic dopant concentration and the intrinsic oxygen concentration on the basis of a difference between the first and second total dopant concentrations and parameters of the heating.

5. The method of claim 1, further comprising
   measuring a first total dopant concentration and determining the process temperature gradient on the basis of a difference between the first total dopant concentration and the extrinsic dopant concentration.

6. The method of claim 1, wherein
   the process temperature gradient is determined on the basis of the generation rate of oxygen-related thermal donors in the semiconductor wafer.

7. The method of claim 6, further comprising
   dissociating oxygen-related thermal donors in an auxiliary heating process before subjecting the semiconductor wafer to a main heat treatment applying the process temperature gradient.

8. The method of claim 1, wherein
   the process temperature gradient is determined on the basis of a dissociation rate of oxygen-related thermal donors in the semiconductor wafer.

9. The method of claim 8, further comprising
   generating a maximum concentration of oxygen-related thermal donors in an auxiliary heating process before subjecting the semiconductor wafer to a main heat treatment applying the process temperature gradient.

10. The method of claim 1, wherein
    the process temperature gradient is an isothermal process given by a constant process temperature and a process time for which the process temperature is applied.

11. The method of claim 1, further comprising
    forming an interlayer dielectric at a front side of the semiconductor wafer before subjecting the semiconductor wafer to the main heat treatment.

12. The method of claim 1, further comprising
forming a plurality of separated semiconductor dies from the semiconductor wafer after subjecting the semiconductor wafer to the main heat treatment.

13. The method of claim 1, wherein
after the main heat treatment at least 25% of the donors in the semiconductor wafer are oxygen-related thermal donors.

14. The method of claim 1, further comprising
forming transistor cells in the semiconductor wafer.

15. The method of claim 1, wherein
the intrinsic oxygen concentration is in a range from $2E17$ $cm^{-3}$ to $6E17$ $cm^{-3}$.

16. The method of claim 1, further comprising
implanting, before generating the oxygen-related donors, protons to form a field stop layer in the semiconductor wafer.

17. The method of claim 16, wherein
a main heat treatment that applies the process temperature gradient in addition activates the implanted protons of the field stop layer.

\* \* \* \* \*